(12) United States Patent
Lee et al.

(10) Patent No.: US 9,252,034 B2
(45) Date of Patent: Feb. 2, 2016

(54) SUBSTRATE PROCESSING SYSTEM AND SUBSTRATE TRANSFERRING METHOD

(75) Inventors: Kyoo Hwan Lee, Yongin-si (KR); Deck Won Moon, Jeju-si (KR); Jae Hwan Jang, Seoul (KR)

(73) Assignee: Jusung Engineering Co., LTD., Gwangju-si (KR)

( * ) Notice: Subject to any disclaimer, the term of this patent is extended or adjusted under 35 U.S.C. 154(b) by 533 days.

(21) Appl. No.: 13/578,237

(22) PCT Filed: Feb. 17, 2011

(86) PCT No.: PCT/KR2011/001048
§ 371 (c)(1),
(2), (4) Date: Oct. 11, 2012

(87) PCT Pub. No.: WO2011/102648
PCT Pub. Date: Aug. 25, 2011

(65) Prior Publication Data
US 2013/0051957 A1 Feb. 28, 2013

(30) Foreign Application Priority Data

Feb. 19, 2010 (KR) ........................ 10-2010-0015079

(51) Int. Cl.
*F16H 25/20* (2006.01)
*H01L 21/67* (2006.01) *H01L 21/677* (2006.01)
*B65G 49/06* (2006.01)

(52) U.S. Cl.
CPC ........ *H01L 21/67173* (2013.01); *B65G 49/061* (2013.01); *B65G 49/067* (2013.01); *H01L21/67742* (2013.01); *B65G 2249/02* (2013.01); *F16H 25/20* (2013.01); *F16H 2025/2043* (2013.01); *F16H 2025/2075* (2013.01)

(58) Field of Classification Search
CPC .............. B25J 9/023; B25J 9/04; B25J 9/041; B25J 9/123; B25J 9/126; B25J 11/0095; B25J 15/0014; B25J 15/0019; B25J 15/0052; B25J 15/0057; B65G 49/061; B65G 49/067; F16H 25/04; F16H 25/08; F16H 25/16; F16H 25/18; F16H 25/183; F16H 25/20; H01L 21/67; H01L 21/67161; H01L 21/67173; H01L 21/67196; H01L 21/677; H01L 21/67703
USPC ............... 74/89.23; 414/217, 222.01, 222.07, 414/222.12, 222.13, 225.01, 226.01, 806, 414/935, 939
See application file for complete search history.

(56) References Cited

U.S. PATENT DOCUMENTS

| | | | |
|---|---|---|---|
| 3,385,120 A * | 5/1968 | Nott ................................ 74/107 |
| 7,959,395 B2 * | 6/2011 | Hofmeister et al. .......... 414/217 |
| 7,988,398 B2 * | 8/2011 | Hofmeister et al. .......... 414/217 |
| 8,545,118 B2 * | 10/2013 | Ogura et al. ................... 396/611 |
| 8,602,706 B2 * | 12/2013 | Hofmeister et al. .......... 414/217 |
| 8,851,008 B2 * | 10/2014 | Fukutomi et al. ............... 118/64 |
| 2004/0151562 A1 * | 8/2004 | Hofmeister et al. .......... 414/217 |
| 2005/0105991 A1 * | 5/2005 | Hofmeister et al. .......... 414/217 |
| 2009/0139450 A1 * | 6/2009 | Ogura et al. ................... 118/600 |
| 2009/0139833 A1 * | 6/2009 | Ogura et al. ................... 198/358 |
| 2009/0162179 A1 * | 6/2009 | Hosek et al. ............... 414/749.2 |
| 2010/0239397 A1 | 9/2010 | Irie |
| 2011/0262252 A1 * | 10/2011 | Lee et al. .................. 414/222.07 |
| 2012/0145073 A1 * | 6/2012 | Fukutomi et al. ............... 118/58 |
| 2012/0145074 A1 * | 6/2012 | Fukutomi et al. ............... 118/58 |
| 2012/0156380 A1 * | 6/2012 | Fukutomi et al. .......... 427/372.2 |
| 2012/0249990 A1 * | 10/2012 | Nishimura et al. ............. 355/72 |

FOREIGN PATENT DOCUMENTS

| | | |
|---|---|---|
| JP | 62-297085 A | 12/1987 |
| JP | 2002-64128 A | 2/2002 |
| JP | 2008-50072 A | 3/2008 |
| WO | 2009/072199 A1 | 6/2009 |

OTHER PUBLICATIONS

International Search Report; International Application No. PCT/KR2011/001048 corresponding to Patent Publication No. WO 2011/102648 A3; Dated Nov. 25, 2011; 6 pages; International Searching Authority/Korean Intellectual Property Office, Republic of Korea.

Kouji Irie; "Substrate Conveying Apparatus and Method of Controlling the Apparatus"; espacenet—Bibliographic data for WO2009072199 (A1); Publication Date: Jun. 11, 2009; Worldwide Database, http://worldwide.espacenet.com/publicationDetails/biblio?DB=EPODOC&II=O&Nd=3&ad . . . .

Takuya Morisawa; "Moving-In/Out Device"; Patent Abstracts of Japan; Publication No. 2008-050072; Publication Date: Mar. 6, 2008; Japan Patent Office, Japan.

Makoto Yoshida; "Bilateral Expansion Conveyor"; espacenet—Bibliographic data for JP62297085 (a); Publication Date: Dec. 24, 1987; Worldwide Database, http://worldwide.espacenet.com/publicationDetails/biblio?DB=EPODOC&II=O&Nd=3&ad . . . .

Osamu Takahashi and Tadayasu Osawa; "Substrate Transfer Device and Substrate Processing Apparatus Provided with This Substrate Transfer Device"; Patent Abstracts of Japan; Publication No. 2002-064128; Publication Date: Feb. 28, 2002; Japan Patent Office, Japan.

* cited by examiner

*Primary Examiner* — Ernesto Suarez
*Assistant Examiner* — Brendan Tighe
(74) *Attorney, Agent, or Firm* — Andrew D. Fortney; Central California IP Group, P.C.

(57) ABSTRACT

A substrate processing system and substrate transferring method is capable of improving substrate-transferring efficiency by transferring a substrate bi-directionally through a substrate transferring device between two rows of processing chambers, and transferring the substrate to a precise position by rotating the substrate transferring device. The processing system includes a transfer chamber, a bi-directional substrate transferring device; and processing chambers which apply a semiconductor-manufacturing process to the substrate. The processing chambers are linearly arranged along two confronting rows, and the transfer chamber is between the two rows of processing chambers. The substrate transferring device includes a moving unit inside the transfer chamber; a bi-directional substrate transferring unit in the moving unit, that transfers the substrate to the processing chamber through a bi-directional sliding movement; and a rotating unit between the moving unit and the bi-directional substrate transferring unit, that rotates the bi-directional substrate transferring unit at a predetermined angle.

20 Claims, 12 Drawing Sheets

SUBSTRATE PROCESSING SYSTEM AND SUBSTRATE TRANSFERRING METHOD

CROSS REFERENCE TO RELATED APPLICATIONS

This application claims the benefit of the Korean Patent Application No. P2010-0015079 filed on Feb. 19, 2010, which is hereby incorporated by reference as if fully set forth herein.

BACKGROUND OF THE INVENTION

1. Field of the Invention

The present invention relates to a substrate processing system, and more particularly, a substrate processing system and a substrate transferring method, which is capable of improving substrate-transferring efficiency by transferring a substrate bi-directionally through the use of substrate transferring device provided between two rows of processing chambers arranged linearly, and transferring the substrate to a precise position by rotating the substrate transferring device.

2. Discussion of the Related Art

Generally, a flat display device and a semiconductor device such as a solar cell can be manufactured by selectively and repetitively applying a plurality of semiconductor-manufacturing processes on a substrate, for example, a deposition process, a photo process, an etching process, a diffusion process, and an ion-implantation process. For smoothly performing the respective semiconductor-manufacturing processes, there is a requirement for a substrate processing system with a multi-chamber structure.

The substrate processing system with the multi-chamber structure is formed in a cluster type including a plurality of processing chambers and a transfer chamber, wherein the plurality of processing chambers carry out at least one process, and the transfer chamber connects the plurality of processing chambers in common.

The transfer chamber is provided with a substrate transferring device to transfer the externally-provided substrate.

The substrate transferring device loads the substrate to each of the processing chambers, or unloads the substrate from each of the processing chambers by lift and rotation movements of a transferring robot.

However, the related art substrate processing system has the following disadvantages.

First, the substrate is transferred to each of the processing chambers arranged in the cluster type by the rotation of the transferring robot, whereby the yield is lowered due to the increased load of the transferring robot.

Also, because a space for the rotation of the transferring robot has to be ensured, the transfer chamber is increased in size, whereby it causes the increase of maintenance time for the transfer chamber.

SUMMARY OF THE INVENTION

Accordingly, the present invention is directed to a substrate processing system and a substrate transferring method that substantially obviates one or more problems due to limitations and disadvantages of the related art.

An object of the present invention is to provide a substrate processing system and a substrate transferring method, which is capable of transferring a substrate bi-directionally through the use of substrate transferring device provided between two rows of processing chambers arranged linearly, thereby improving the substrate-transferring efficiency.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a substrate processing system comprising: a transfer chamber which has at least one bi-directional substrate transferring device for bi-directionally transferring a substrate; and a plurality of processing chambers which apply a semiconductor-manufacturing process to the substrate, wherein the plurality of processing chambers are linearly arranged along two rows confronting each other, and the transfer chamber is interposed between the two rows of the processing chambers, wherein the at least one bi-directional substrate transferring device comprises: a moving unit which is provided inside the transfer chamber, and is horizontally moved; a bi-directional substrate transferring unit which is provided in the moving unit, and transfers the substrate to the processing chamber through a bi-directional sliding movement; and a rotating unit which is provided between the moving unit and the bi-directional substrate transferring unit, and rotates the bi-directional substrate transferring unit at a predetermined angle.

In another aspect of the present invention, a substrate processing system comprises first and second processing chambers confronting each other arranged in parallel, the first and second processing chambers for applying a semiconductor-manufacturing process to a substrate; and at least one bi-directional substrate transferring device provided between the first and second processing chambers, the at least one bi-directional substrate transferring device for transferring the substrate to the first or second processing chamber by simultaneously sliding a plurality of sliding members, wherein the at least one bi-directional substrate transferring device comprises a rotating unit which rotates the plurality of sliding members at a predetermined angle.

In another aspect of the present invention, a substrate transferring method for transferring a substrate between a load-lock chamber and a processing chamber for applying a semiconductor-manufacturing process to a substrate, the processing chamber confronting the load-lock chamber, comprises transferring any one of at least one bi-directional substrate transferring devices to a space between the load-lock chamber and the processing chamber, wherein the bi-directional substrate transferring device comprises a moving unit, a bi-directional substrate transferring unit, and a rotating unit positioned between the moving unit and the bi-directional substrate transferring unit; loading the substrate by linearly moving a plurality of sliding members, bi-directional slidably provided in the bi-directional substrate transferring unit, into the inside of the load-lock chamber at the same time, and restoring the plurality of sliding members to their original positions by the simultaneous linear movement; rotating the plurality of sliding members at a predetermined angle by rotating the bi-directional substrate transferring unit following the operation of the rotating unit; loading the substrate rotated at a predetermined angle to the processing chamber by linearly moving the plurality of sliding members rotated; restoring the plurality of rotated sliding members to their original positions by the linear movement; and rotating the plurality of sliding members to their original positions by rotating the bi-directional substrate transferring unit to its original position according to the operation of the rotating unit.

In another aspect of the present invention, a substrate transferring method for transferring a substrate between a load-lock chamber and a processing chamber for applying a semiconductor-manufacturing process to a substrate, the processing chamber confronting the load-lock chamber, comprises transferring any one of at least one bi-directional substrate transferring devices to a space between the load-lock chamber and the processing chamber; loading the substrate by linearly moving a plurality of sliding members, bi-directional slidably provided in the bi-directional substrate transferring device, into the inside of the load-lock chamber at the same time, and restoring the plurality of sliding members to their original positions by the simultaneous linear movement; rotating the plurality of sliding members at a predetermined angle; loading the substrate rotated at a predetermined angle to the processing chamber by sliding the plurality of rotated sliding members at the same time; restoring the plurality of rotated sliding members to their original positions by the linear movement; and rotating the plurality of sliding members to their original positions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a substrate processing system and a substrate transferring method according to the present invention will be described with reference to the accompanying drawings.

Figure 1:
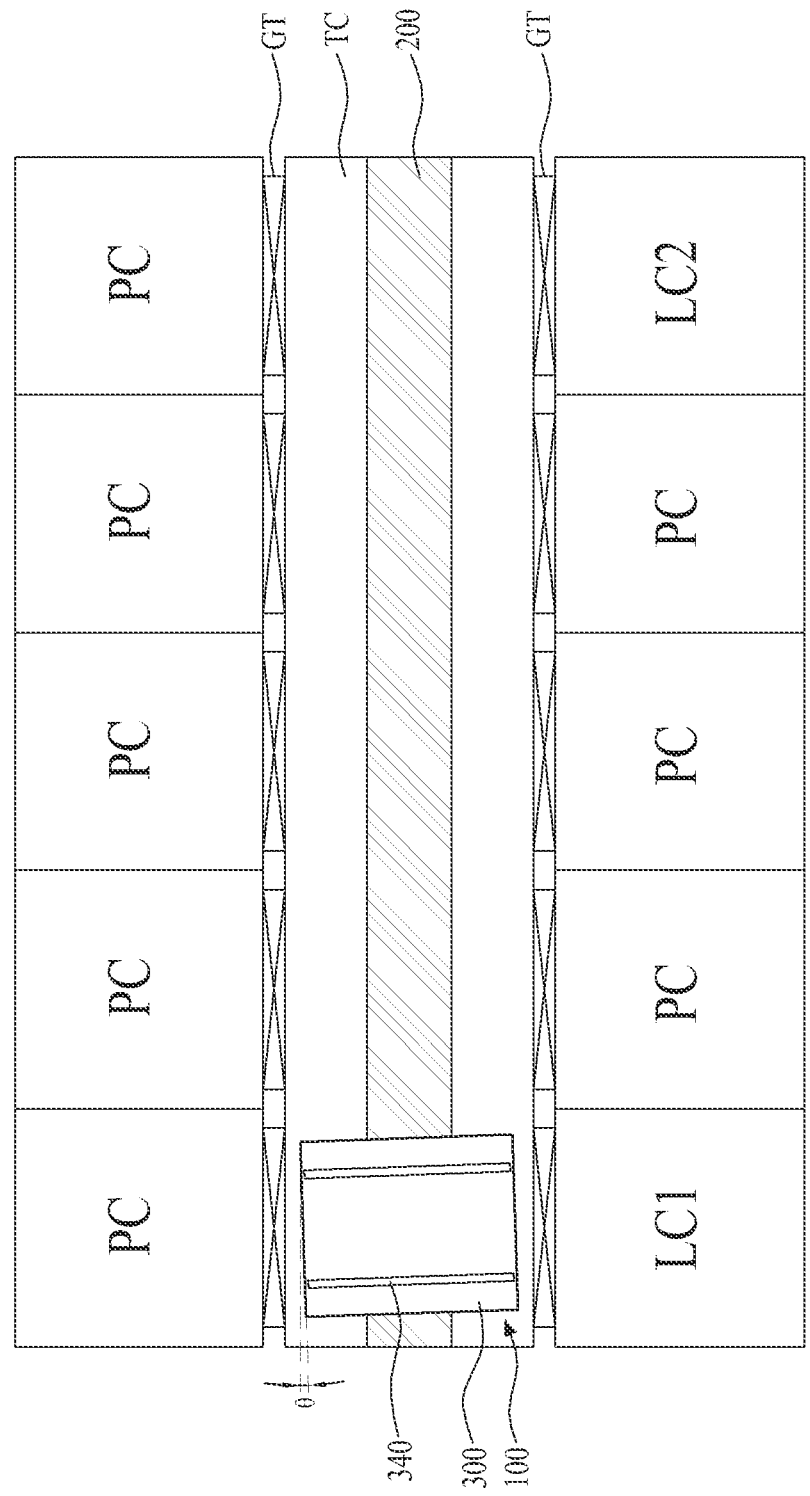
FIG. 1 illustrates a substrate processing system according to the embodiment of the present invention.

FIG. 1 illustrates a substrate processing system according to the embodiment of the present invention.

Referring to FIG. 1, the substrate processing system according to the embodiment of the present invention includes a transfer chamber (TC) for transferring a substrate; at least one load-lock chamber (LC) arranged to be in connection with the transfer chamber (TC); and a plurality of processing chambers (PCs) arranged along two rows confronting each other with the transfer chamber (TC) interposed therebetween in parallel.

The load-lock chamber (LC) may be provided in at least one side of both sides of the transfer chamber (TC). The load-lock chamber (LC) enables to load the substrate (not shown) into the transfer chamber (TC) from the external, or to unload the substrate (not shown) from the transfer chamber (TC) to the external. Between the load-lock chamber (LC) and the transfer chamber (TC), there may be a gate (GT) for easily loading or unloading the substrate therethrough.

Each of the processing chambers (PCs) carries out a corresponding semiconductor-manufacturing process to the substrate transferred from the transfer chamber (TC). At this time, the semiconductor-manufacturing process may be any one process among various processes for manufacturing a semiconductor device such as a flat display device and a solar cell. For example, the semiconductor-manufacturing process may be a deposition process, a cleaning process, a preheating process, a drying process, a heating process, a photo process, an etching process, a diffusion process, or an ion implantation process.

The plurality of processing chambers (PCs) may be linearly arranged in each of upper and lower sides of the transfer chamber (TC). Also, each gate (GT) may be provided between each of the processing chambers (PCs) and the transfer chamber (TC) so that the substrate can be easily loaded or unloaded through the gate (GT).

Between the two rows of the processing chambers (PCs), the transfer chamber (TC) is interposed while being provided with the plurality of gates (GT), wherein each gate (GT) is provided to be in connection with each of the processing chambers (PCs). At this time, the inside of the transfer chamber (TC) may be maintained under the vacuum state.

The transfer chamber (TC) may be provided with a bi-directional substrate transferring device 100 so as to transfer the substrate from the load-lock chamber (LC) to each processing chamber (PC) or to transfer the substrate from each processing chamber (PC) to the load-lock chamber (LC). At this time, the bi-directional substrate transferring device 100 horizontally moves inside the transfer chamber (TC) so as to transfer the substrate among the plurality of processing chambers (PCs).

Figure 2:
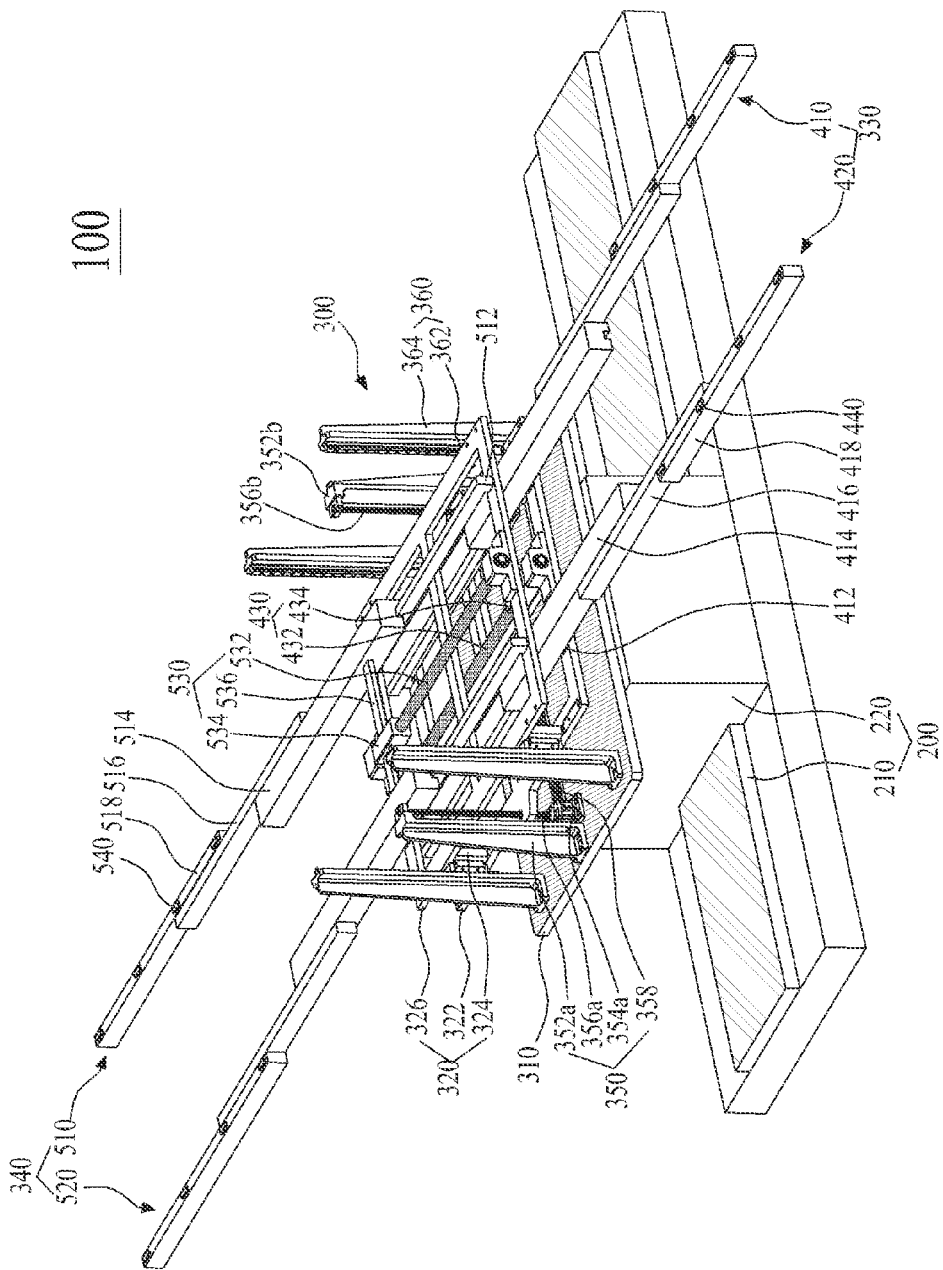
FIG. 2 is a perspective view illustrating a bi-directional substrate transferring device according to the embodiment of the present invention.
Figure 3:
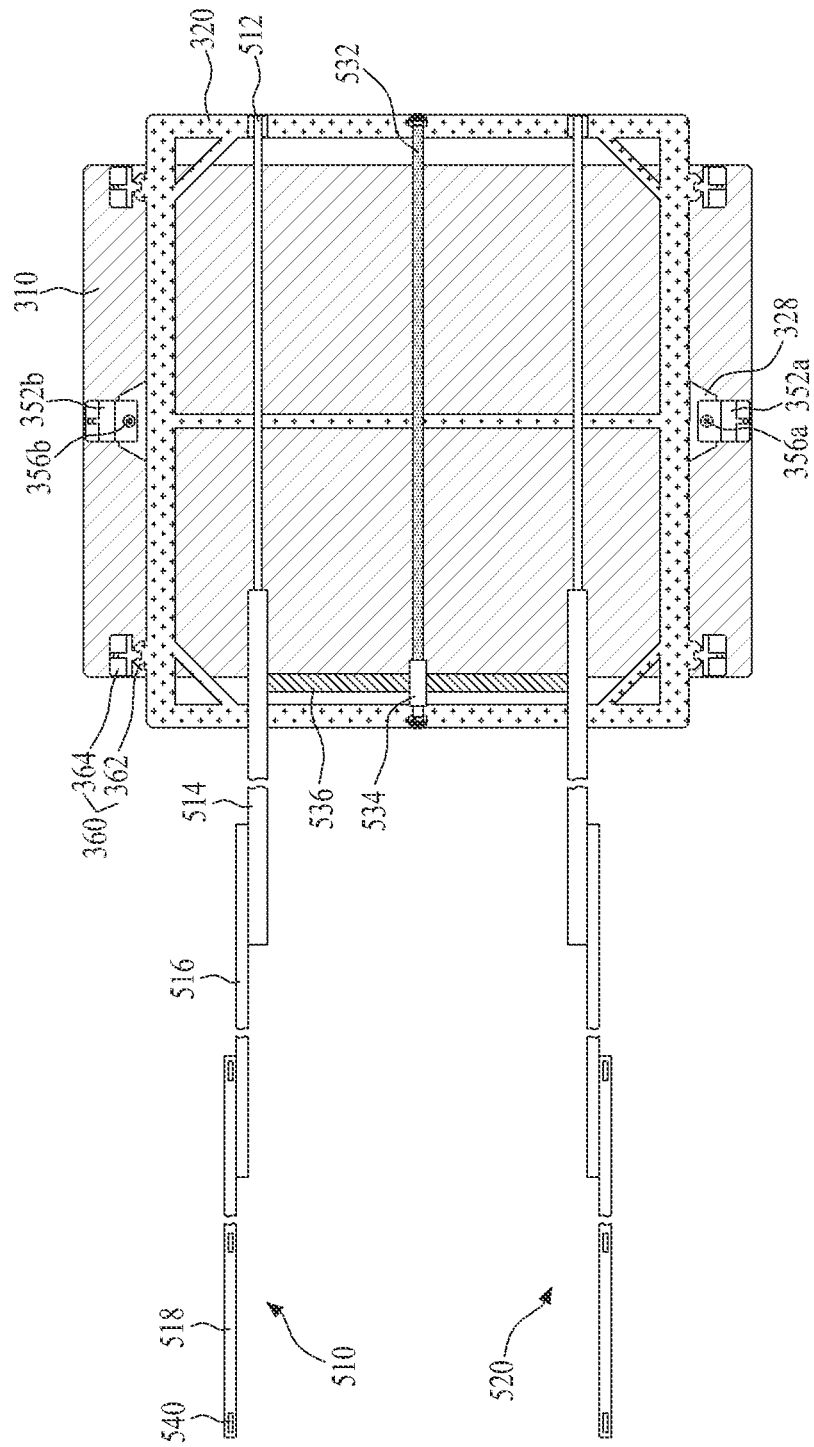
FIG. 3 is a plane view illustrating a bi-directional substrate transferring device according to the embodiment of the present invention.

FIG. 2 is a perspective view illustrating the bi-directional substrate transferring device according to the embodiment of the present invention. FIG. 3 is a plane view illustrating the bi-directional substrate transferring device according to the embodiment of the present invention.

Referring to FIGS. 2 and 3 in connection with FIG. 1, the bi-directional substrate transferring device 100 according to one embodiment of the present invention includes a moving unit 200 and a bi-directional substrate transferring unit 300.

The moving unit 200 according to one embodiment of the present invention is provided in a longitudinal direction of the transfer chamber (TC) so as to horizontally move the bi-directional substrate transferring unit 300. For this, the moving unit 200 may be formed of a linear motor.

In one embodiment of the present invention, the moving unit 200 includes a moving guide 210 and a moving block 220.

The moving guide 210 guides a horizontal movement of the moving block 220. For example, the moving guide 210 may be a stator for the linear motor.

The moving block 220 may be movably provided in the moving guide 210 so that the moving block 220 may be horizontally moved along the moving guide 210. For example, the moving block 220 may be a rotor (or coil) for the linear motor.

In one embodiment of the present invention, the bi-directional substrate transferring unit 300 includes a base frame 310, a fork frame 320, first and second bi-directional sliding forks 330 and 340, a fork lift 350, and a fork lift guide 360.

The base frame 310 is provided on the moving block 220 of the moving unit 200, whereby the base frame 310 horizontally moves together with the moving block 220.

The fork frame 320 according to one embodiment of the present invention includes a first support frame 322, a plurality of sidewall supporters 324, and a second support frame 326.

The first support frame 322 is provided at a predetermined height on the base frame 310, wherein the first support frame 322 is supported to be lifted or lowered by the fork lift 350. At this time, protrusions 328 are provided at first and second lateral sides of the first support frame 322, wherein the fork lift 350 passes through the protrusions 328 while being in contact with the protrusions 328.

According as the plurality of sidewall supporters 324 are provided at fixed intervals along the edge of the first support frame 322, the plurality of sidewall supporters 324 support the second support frame 326.

The second support frame 326 is provided on the plurality of sidewall supporters 324 while the second support frame 326 is overlapped with the first support frame 322. Also, the second support frame 326 is lifted and lowered together with the first support frame 322.

The first bi-directional sliding fork 330 according to one embodiment of the present invention includes first and second sliding forks 410 and 420, a first fork slider 430, and a plurality of first substrate-supporting pads 440.

The first and second sliding forks 410 and 420 are provided on the first support frame 322, wherein the first and second sliding forks 410 and 420 are provided in parallel at a predetermined interval therebetween. According to an operation of the first fork slider 430, the first and second sliding forks 410 and 420 may be moved to a first or second horizontal direction, wherein the first and second horizontal directions are opposite to each other. For this, each of the first and second sliding forks 410 and 420 includes a first guide block 412, and first to third sliding members (hereinafter, referred to as "sliding bars") 414, 416 and 418.

The first guide block 412 is provided on the first support frame 322, and more particularly, between both lateral sides of the first support frame 322, wherein the first guide block 412 guides the sliding movement of the first sliding bar 414.

The first sliding bar 414 is provided in the first guide block 412. According to an operation of the first fork slider 430, the first sliding bar 414 may be moved to the first or second horizontal direction.

The second sliding bar 416 is provided at a lateral side of the first sliding bar 414. That is, according as the second sliding bar 416 is interlocked with the first sliding bar 414, the second sliding bar 416 moves horizontally following the sliding movement of the first sliding bar 414.

The third sliding bar 418 is provided at a lateral side of the second sliding bar 416. That is, according as the third sliding bar 418 is interlocked with the second sliding bar 416, the third sliding bar 418 moves horizontally following the sliding movement of the second sliding bar 416.

The second and third sliding bars 416 and 418 are sequentially provided on the first sliding bar 414. Thus, the second and third sliding bars 416 and 418 may be moved horizontally following the sliding movement of the first sliding bar 414.

The first fork slider 430 is provided on the first support frame 322, and more particularly, between both lateral sides of the first support frame 322, so that the first fork slider 430 is provided between the first and second sliding forks 410 and 420. Thus, the first fork slider 430 moves both the first and second sliding forks 410 and 420 simultaneously to the first or second horizontal direction, wherein the first and second horizontal direction are opposite to each other. For this, the first fork slider 430 includes a first guide bar 432 and a first moving cylinder 434. At this time, the first guide bar 432 is provided on the first support frame 322, and more particularly, between both lateral sides of the first support frame 322, so that the first fork slider 430 is supported by a bracket. Also, the first moving cylinder 434 is movably provided in the first guide bar 432, wherein the first moving cylinder 434 includes a link (not shown) connected with the respective first and second sliding forks 410 and 420. The first fork slider 430 may be formed of a hydraulic or pneumatic cylinder to move the first moving cylinder 434 by a hydraulic or pneumatic pressure supplied to at least one side of the first guide bar 432.

The plurality of first substrate-supporting pads 440 are provided at fixed intervals on the third sliding bar 418, wherein the plurality of first substrate-supporting pads 440 support one rear surface of the substrate during the process for transferring the substrate.

The aforementioned embodiment of the present invention discloses that the first bi-directional sliding fork 330 includes the two sliding forks 410 and 420, but not necessarily. For stably transferring the substrate, the number of sliding forks included in the first bi-directional sliding fork 330 may be more than two. Also, the aforementioned embodiment of the present invention discloses that the first fork slider 430 of the first bi-directional sliding fork 330 is formed of the hydraulic or pneumatic cylinder, but not necessarily. The sliding forks 410 and 420 may slide through the use of at least two among an LM guide, a ball screw, and a belt, without using the first fork slider 430. Furthermore, the first bi-directional sliding fork 330 may slide the sliding forks 410 and 420 in an electromagnetic motor type obtained by combining at least one or two of the LM guide, the ball screw and the belt, without using the first fork slider 430.

The first bi-directional sliding fork 330 may further include a position-detecting sensor to control the first fork slider 430 by detecting a sliding position for the bi-directional sliding of the sliding bars 414, 416 and 418.

The first bi-directional sliding fork 330 simultaneously slides both the first and second sliding forks 410 and 420 to the first or second horizontal direction by extending or retracting the first and second sliding forks 410 and 420 through the use of first fork slider 430, wherein the first and second horizontal directions are opposite to each other. Thus, the substrate can be bi-directionally transferred to any one of the processing chambers (PCs) arranged along the upper and lower sides of the transfer chamber (TC).

The second bi-directional sliding fork 340 according to one embodiment of the present invention may include third and fourth sliding forks 510 and 520, a second fork slider 530, and a plurality of second substrate-supporting pads 540.

The third and fourth sliding forks 510 and 520 are provided on the second support frame 326, wherein the third and fourth sliding forks 510 and 520 are provided in parallel at a predetermined interval therebetween. According to an operation of the second fork slider 530, the third and fourth sliding forks 510 and 520 may be moved to the first or second horizontal direction. For this, each of the third and fourth sliding forks 510 and 520 includes a second guide block 512, and fourth to sixth sliding bars 514, 516 and 516.

The second guide block 512 is provided on the second support frame 326, and more particularly, between both lateral sides of the second support frame 326, wherein the second guide block 512 guides the sliding movement of the fourth sliding bar 514.

The fourth sliding bar 514 is provided in the second guide block 512. According to an operation of the second fork slider 530, the fourth sliding bar 514 may be moved to the first or second horizontal direction.

The fifth sliding bar 516 is provided at a lateral side of the fourth sliding bar 514. That is, according as the fifth sliding bar 516 is interlocked with the fourth sliding bar 514, the fifth sliding bar 516 moves horizontally following the sliding movement of the fourth sliding bar 514.

The sixth sliding bar 518 is provided at a lateral side of the fifth sliding bar 516. That is, according as the sixth sliding bar 518 is interlocked with the fifth sliding bar 516, the sixth sliding bar 518 moves horizontally following the sliding movement of the fifth sliding bar 516.

The fifth and sixth sliding bars 516 and 518 are sequentially provided on the fourth sliding bar 514. Thus, the fifth and sixth sliding bars 516 and 518 may be moved horizontally following the sliding movement of the fourth sliding bar 514.

The second fork slider 530 is provided on the second support frame 326, and more particularly, between both lateral sides of the second support frame 326, so that the second fork slider 530 is provided between the third and fourth sliding forks 510 and 520. Thus, the second fork slider 530 moves both the third and fourth sliding forks 510 and 520 simultaneously to the first or second horizontal direction, wherein the first and second horizontal direction are opposite to each other. For this, the second fork slider 530 includes a second guide bar 532 and a second moving cylinder 534. At this time, the second guide bar 532 includes a second guide bar 532 and a second moving cylinder 534. The second guide bar 532 is provided on the second support frame 326, and more particularly, between both lateral sides of the second support frame 326, so that the second fork slider 530 is supported by a bracket. Also, the second moving cylinder 534 is movably provided in the second guide bar 532, wherein the second moving cylinder 534 includes a link 536 connected with the respective third and fourth sliding forks 510 and 520. The second fork slider 530 may be formed of a hydraulic or pneumatic cylinder to move the second moving cylinder 534 by a hydraulic or pneumatic pressure supplied to at least one side of the second guide bar 532.

The plurality of second substrate-supporting pads 540 are provided at fixed intervals on the sixth sliding bar 518, wherein the plurality of second substrate-supporting pads 540 support one rear surface of the substrate during the process for transferring the substrate.

The aforementioned embodiment of the present invention discloses that the second bi-directional sliding fork 340 includes the two sliding forks 510 and 520, but not necessarily. For stably transferring the substrate, the number of sliding forks included in the second bi-directional sliding fork 340 may be more than two. Also, the aforementioned embodiment of the present invention discloses that the second fork slider 530 of the second bi-directional sliding fork 340 is formed of the hydraulic or pneumatic cylinder, but not necessarily. The sliding forks 510 and 520 may slide through the use of at least two among the LM guide, the ball screw, and the belt, without using the second fork slider 530. Furthermore, the second bi-directional sliding fork 340 may slide the sliding forks 510 and 520 in the electromagnetic motor type obtained by combining at least one or two of the LM guide, the ball screw and the belt, without using the second fork slider 530.

The second bi-directional sliding fork 340 may further include a position-detecting sensor to control the second fork slider 530 by detecting a sliding position for the bi-directional sliding of the sliding bars 514, 516 and 518.

The second bi-directional sliding fork 340 slides both the third and fourth sliding forks 510 and 520 to the first or second horizontal direction by extending or retracting the third and fourth sliding forks 510 and 520 through the use of second fork slider 530. Thus, the substrate can be bi-directionally transferred to any one of the processing chambers (PCs) arranged along the upper and lower sides of the transfer chamber (TC).

The fork lift 350 according to one embodiment of the present invention includes a first lift supporter 352a, a second lift supporter 352b, a first lifting unit (hereinafter, referred to as "first lift motor") 354a, a second lift unit (hereinafter, referred to as "second lift motor") (not shown), a first frame lifting member 356a (hereinafter, referred to as "first ball screw") 356a, a second frame lifting member (hereinafter, referred to as "second ball screw") 356b, and an interlock member (hereinafter, referred to as "interlock shaft") 358.

The first lift supporter 352a is provided for being vertical to the base frame 310 while being adjacent to a first lateral side of the fork frame 320.

The second lift supporter 352b is provided for being vertical to the base frame 310 while being confronted with the first lift supporter 352a at a second lateral side of the fork frame 320.

As the first lift motor 354a is provided on the base frame 310 while being adjacent to an inner lateral side of the first lift supporter 352a, the first lift motor 354a rotates the first ball screw 356a to a first or second direction, wherein the first and second directions are opposite to each other.

As the second lift motor is provided on the base frame 310 while being adjacent to an inner lateral side of the second lift supporter 352b, the second lift motor makes the second ball screw 356b rotate to the same direction as that of the first ball screw 356a.

According as the first ball screw 356a is provided between the first lift supporter 352a and the first lift motor 354a while passing through the protrusion 328 provided in the first support frame 322 of the fork frame 320, the first lateral side of the fork frame 320 is lifted by the rotation of the first lift motor 354a. At this time, the protrusion 328 provided in the first support frame 322 forms a screw thread to be engaged with the first ball screw 356a.

According as the second ball screw 356b is provided between the second lift supporter 352b and the second lift motor while passing through the protrusion 328 provided in the first support frame 322 of the fork frame 320, the second lateral side of the fork frame 320 is lifted by the rotation of the second lift motor. At this time, the protrusion 328 provided in the first support frame 322 forms a screw thread to be engaged with the second ball screw 356b.

The interlock shaft 358 is provided between the first lift motor 354a and the second lift motor so as to transfer a rotary power of the first lift motor 354a or second lift motor to another lift motor, whereby the rotation of the first lift motor 354a is interlocked and synchronized with the rotation of the second lift motor.

The fork lift 350 lifts or lowers the fork frame 320 according to the rotation of the first and second ball screws 356a and 356b based on the rotation of the first lift motor 354a and second lift motor, whereby the first or second bi-direction sliding fork 330 or 340 can be lifted or lowered to a predetermined height.

The fork lift 350 may further include a position-detecting sensor to control the rotation of the first lift motor 354a and second lift motor by detecting a lifting position of the fork frame 320.

The fork lift guide 360 according to one embodiment of the present invention includes a plurality of first lift guide members (hereinafter, referred to as "lift guide blocks") 362, and a plurality of second lift guide members (hereinafter, referred to as "lift guide rails") 364.

The plurality of lift guide blocks 362 are provided in the sidewall supporters 324 corresponding to the corners of the first and second lateral sides in the fork frame 320. At this time, two of the lift guide blocks 362 may be provided at each of the first and second lateral sides of the fork frame 320.

The plurality of lift guide rails 364 are provided for being vertical to the base frame 310 while being in contact with each lift guide block 362. Thus, when the fork frame 320 is lifted or lowered, the plurality of lift guide rails 364 guide the lifting or lowering movement of the lift guide blocks 362.

Figure 4:
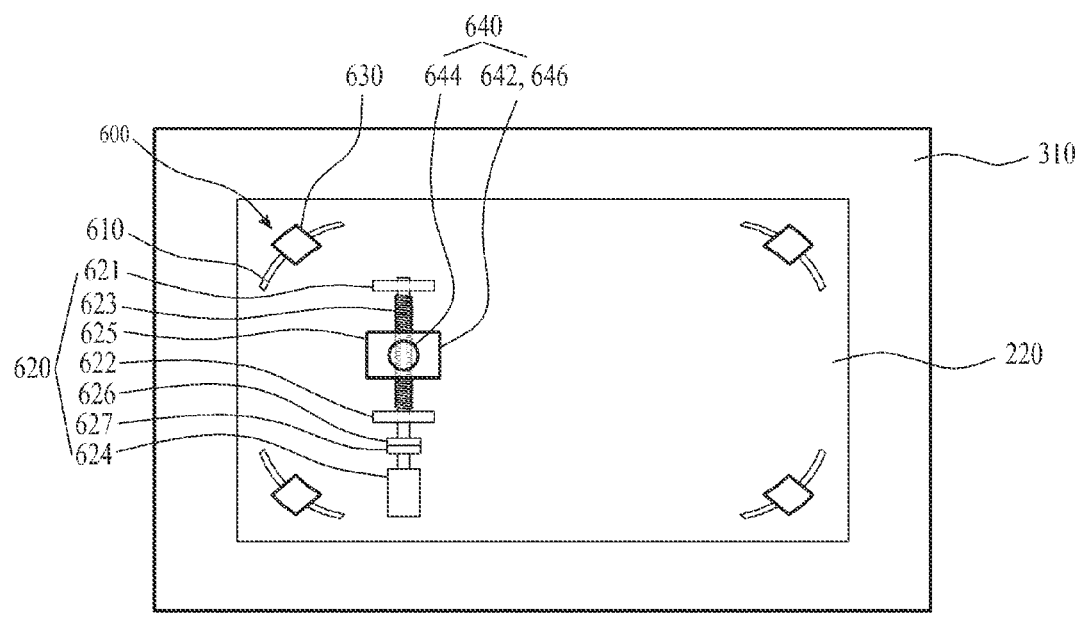
FIG. 4 illustrates a rotating unit according to the embodiment of the present invention.

In the substrate processing system according to the embodiment of the present invention, the substrate-loading position may be different among the respective processing chambers (PC). Accordingly, as shown in FIG. 4, the bi-directional substrate transferring device 100 of the substrate processing system according to the embodiment of the present invention may further comprise a rotating unit 600 which is provided between the moving unit 200 and the bi-directional substrate transferring unit 300 so as to provide the substrate to be loaded into each processing chamber (PC) at the appropriate loading position by rotating the bi-directional substrate transferring unit 300 at a predetermined angle ($\theta$).

The rotating unit 600 comprises a first rotating guide 610 provided in the moving block 220 of the moving unit 200; a rotating part 620 provided in the moving block 220; a second rotating guide 630 provided in the base frame 310 of the bi-direction substrate transferring unit 300 and rotated by the first rotating guide 610; and a rotating axis part 640 provided in the base frame 310 of the bi-directional substrate transferring unit 300 and linearly moved by the rotation of the rotating part 620, and simultaneously rotating the base frame 310 at a predetermined angle ($\theta$).

Figure 5:
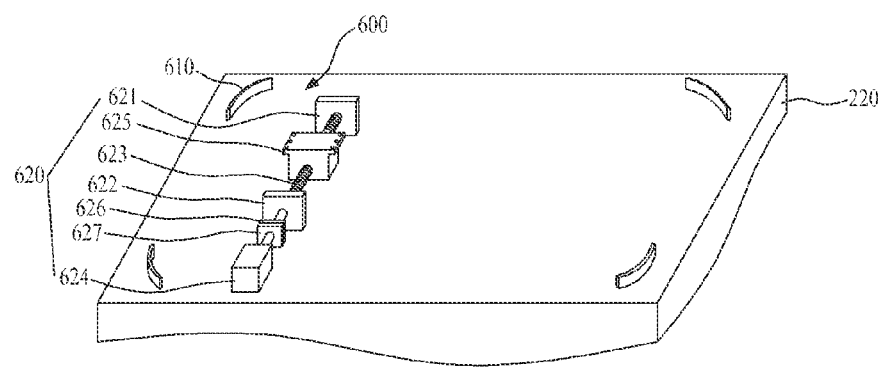
FIG. 5 illustrates a first rotating guide and a rotating part shown in FIG. 4.

As shown in FIG. 5, the first rotating guide 610 is provided with four LM guide rails which are provided at four corners of the upper surface of the moving block 220. The four LM guide rails may be formed as curve-lined shape with a predetermined curvature.

The first rotating guide 610 may be provided with four LM guide blocks which are provided at four corners of the upper surface of the moving block 220.

The rotating part 620 comprises first and second brackets 621 and 622 installed at one side of the upper surface of the moving block 220 and provided at a predetermined interval therebetween; a rotation member 623 passing through the first and second brackets 621 and 622; a driving member 624 for rotating the rotation member 623; and a housing 625 linearly moved following the rotation of the rotation member 623.

The first bracket 621 is installed at one side of the upper surface of the moving block 220, wherein the first bracket 621 rotatably supports the other side of the rotation member 623.

The second bracket 622 confronts the first bracket 621 while being provided at a predetermined interval from the first bracket 621. The second bracket 622, which is installed in the upper surface of the moving block 220, rotatably supports the one lateral side of the rotation member 623.

The rotation member 623 passing through the second bracket 622 is rotatably provided in the first bracket 621.

The driving member 624 is connected with the rotation member 623 passing through the second bracket 622, to thereby rotate the rotation member 623. At this time, the rotation member 623 and the driving member 624 are connected with each other by combining a first coupler 626 provided at one side of the rotation member 623 with a second coupler 627 provided at a driving axis of the driving member 624, whereby the rotation member 623 rotates following the rotation of the driving member 624. In this case, the driving member 624 may be a rotary motor.

The housing 625 is provided in the rotation member 623, wherein the housing 625 linearly moves following the rotation of the rotation member 623.

The rotating part 620 makes the housing 625 move linearly following the driving of the driving member 624.

Preferably, the aforementioned rotating part 620 is positioned toward one side of the moving block 220 for the smooth rotation of the base frame 310, that is, the rotating part 620 is provided adjacent to one edge of the moving block 220.

Figure 6:
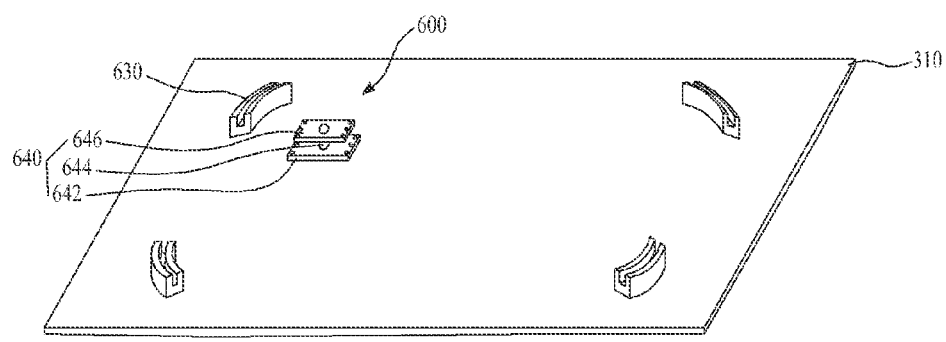
FIG. 6 illustrates a second rotating guide and a rotating axis part shown in FIG. 4.

As shown in FIG. 6, the second rotating guide 630 is provided with four LM guide blocks which are provided at four corners of the rear surface of the base frame 310 while being corresponding to the first rotating guide 610. The four LM guide blocks may be formed as curve-lined shape with a predetermined curvature.

If the first rotating guide 610 is provided with the LM guide blocks, the second rotating guide 630 may be provided with four LM guide rails at four corners of the rear surface of the base frame 310 while being corresponding to the first rotating guide 610.

The second rotating guide 630 rotates following the first rotating guide 610 by the linear movement of the housing 625 according to the driving of the rotating part 620.

The rotating axis part 640 comprises a first support plate 642 provided on the rear surface of the base frame 310, a rotating axis 644 rotatably provided in the first support plate 642, and a second support plate 646 provided in the rotating axis 644 and combined with the housing 625 of the rotating part 620.

The first support plate 642 is provided on the rear surface of the base frame 310 by a screw (not shown).

The rotating axis 644 is rotatably provided in the first support plate 642 so that the first support plate 642 is rotated.

The second support plate 646 is connected with an end of the rotating axis 644, and is combined with the housing 625 by a screw.

The rotating axis part 640 makes the second rotating guide 630 rotate following the first rotating guide 610 by the linear movement of the second support plate 646 and/or rotating axis 644 according to the linear movement of the housing 625, to thereby rotating the base frame 310 at a predetermined angle ($\theta$).

Figure 7:
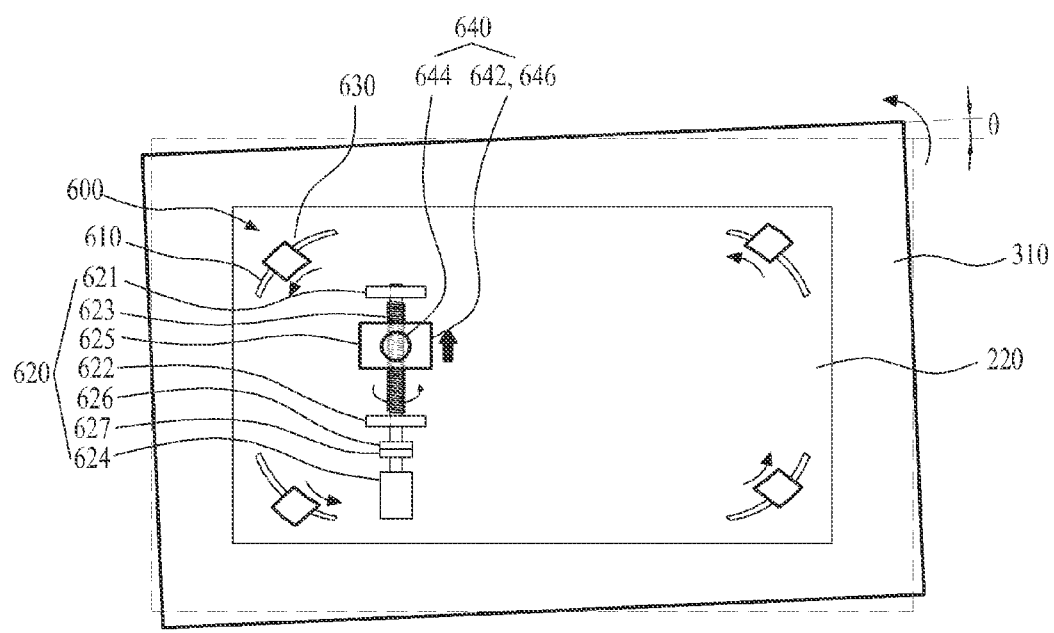
FIG. 7 illustrates a base frame rotated by a rotating unit shown in FIGS. 4 to 6.

As shown in FIG. 7, the rotating unit 600 linearly moves the housing 625 by driving the driving member 624 according to the substrate-rotating angle which is set to be corresponding to the substrate-loading position of each processing chamber (PC), whereby the base frame 310 is rotated at a predetermined angle (θ) by the linear movement and rotational movement of the rotating axis part 640 combined with the housing 625. By the rotation of the base frame 310, the substrate placed onto the bi-directional substrate transferring unit 300, that is, the first and second bi-directional sliding forks 330 and 340, is rotated at a predetermined angle (θ) so that the substrate is aligned to the substrate-loading position in each processing chamber (PC).

According as the bi-directional substrate transferring device 100 moves to the processing chamber (PC) or load-lock chamber (LC) by the horizontal movement of the moving unit 200, the substrate can be transferred bi-directionally by the bi-directional substrate transferring device 100. Because the bi-directional substrate transferring device 100 bi-directionally transfers the substrate through the bi-directional sliding movement of the first and second bi-directional sliding forks 330 and 340, there is no requirement for the rotation of the substrate when bi-directionally transferring the substrate.

Also, the bi-directional substrate transferring device 100 rotates the first and second bi-directional sliding forks 330 and 340 at a predetermined angle (θ) by the rotation of the rotating unit 600; and then loads the substrate by extending or retracting the first and second sliding forks 410 and 420 or/and the third and fourth sliding forks 510 and 520, which enables to align the substrate to the precise substrate-loading position in each processing chamber (PC).

Figure 8:
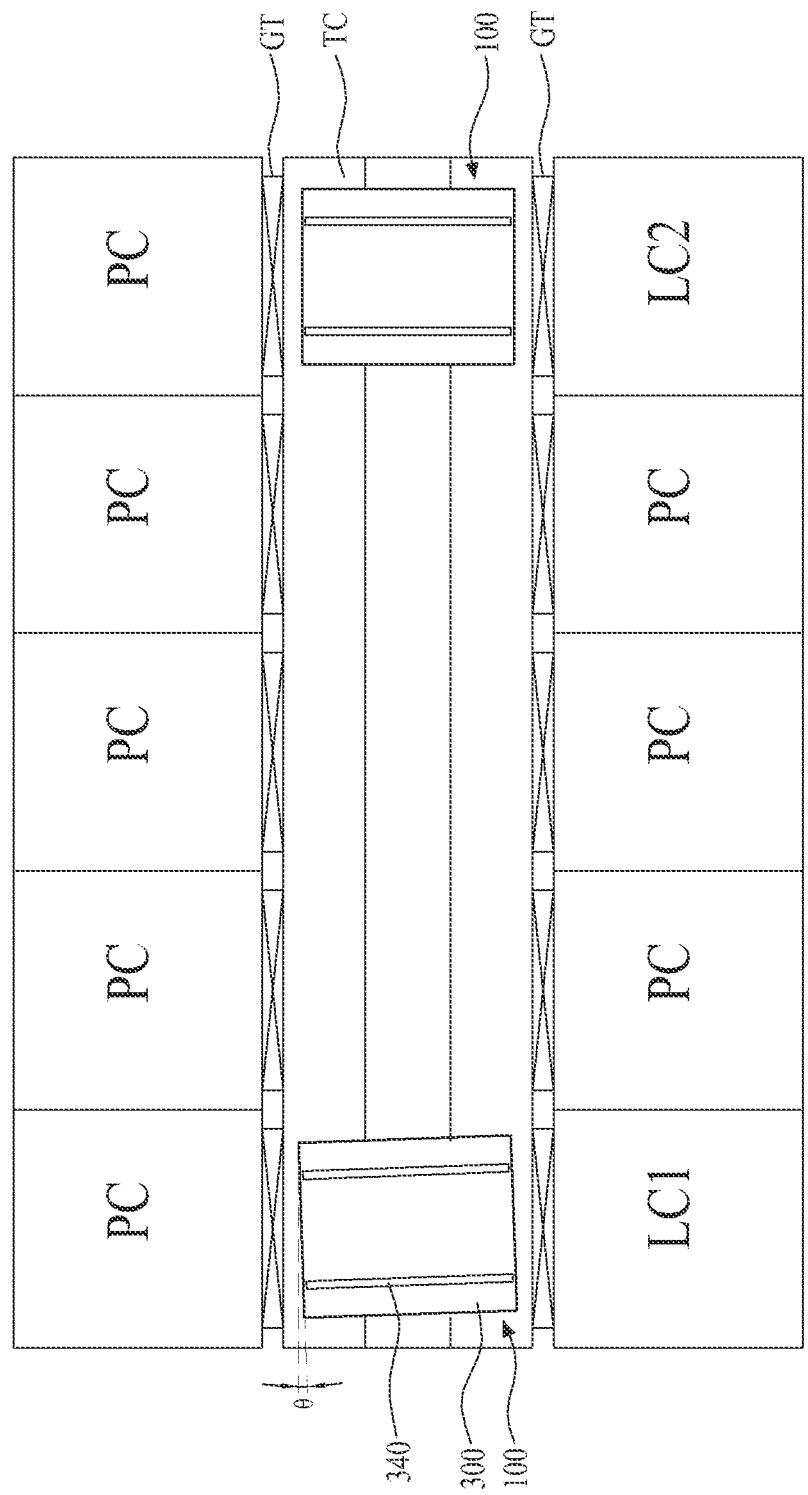
FIG. 8 illustrates a transfer chamber provided with a plurality of bi-directional substrate transferring devices in a substrate processing system according to the embodiment of the present invention.

For improving the substrate-transferring efficiency, the aforementioned transfer chamber (TC) may include the plurality of bi-directional substrate transferring devices 100, as shown in FIG. 8. In this case, the number of bi-directional substrate transferring devices 100 may be changed according to the length of the transfer chamber (TC). Each of the bi-directional substrate transferring devices 100 is identical in structure to the aforementioned bi-directional substrate transferring device, whereby each of the bi-directional substrate transferring devices 100 can transfer the corresponding substrate provided in a predetermined area of the transfer chamber (TC). Hereinafter, supposing that the transfer chamber (TC) has one bi-directional substrate transferring device 100.

FIGS. 9 to 14 illustrate the substrate transferring method of the substrate processing system according to the embodiment of the present invention.

The substrate transferring method of the substrate processing system according to the embodiment of the present invention will be described with reference to FIGS. 9 to 14 in connection with FIGS. 2 to 4.

Figure 9:
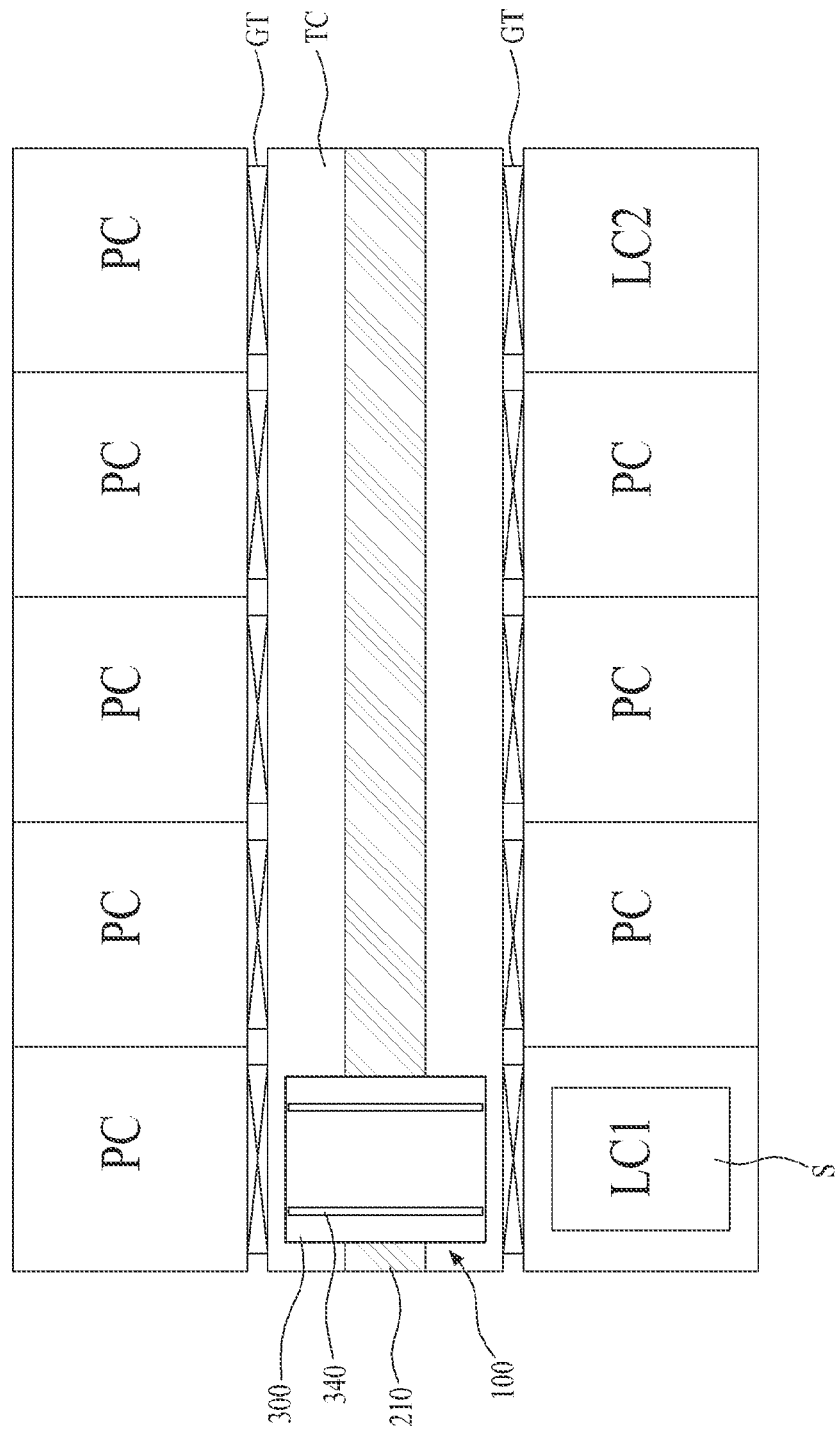
FIGS. 9 to 14 illustrate a substrate transferring method by the use of substrate processing system according to the embodiment of the present invention.

First, as shown in FIG. 9, when the substrate (S) is transferred to the first load-lock chamber (LC1) from the external, the bi-directional substrate transferring device 100 moves the bi-directional substrate transferring unit 300 to the first load-lock chamber (LC1) by moving the moving unit 200.

Figure 10:
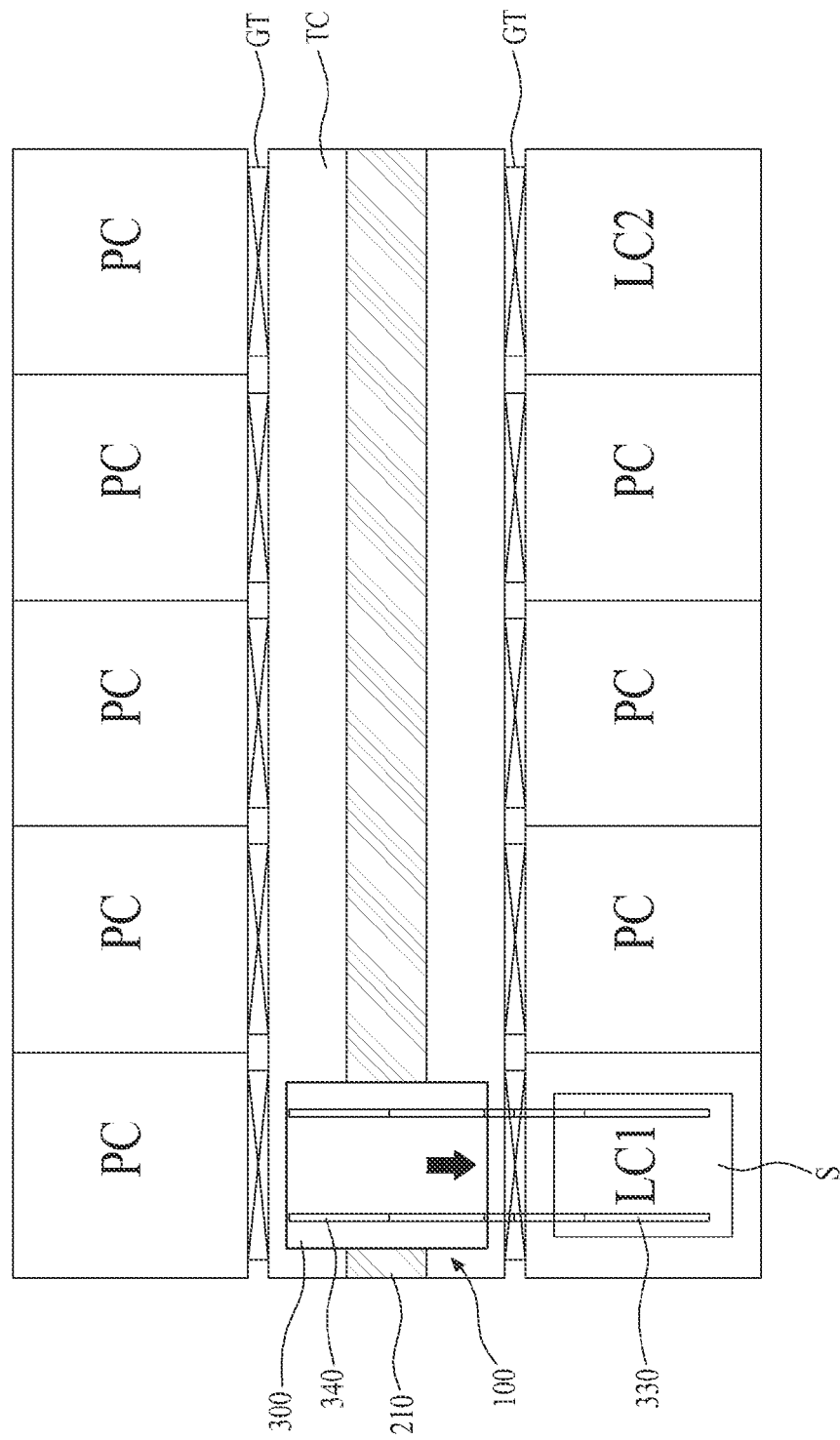

Then, as shown in FIG. 10, the bi-directional substrate transferring device 100 operates the fork lift 350 so that the first bi-directional sliding fork 330 of the fork frame 320 is lifted or lowered to have the same height as the substrate (S) transferred to the first load-lock chamber (LC1). Thereafter, the bi-directional substrate transferring device 100 makes the sliding bars 414, 416 and 418 of the first bi-directional sliding fork 330 slide into the first direction, that is, the inside of the first load-lock chamber (LC1); and then places the substrate (S) onto the first bi-directional sliding fork 330 by lifting the fork frame 320 to the predetermined height through an operation of the fork lift 350.

Figure 11:
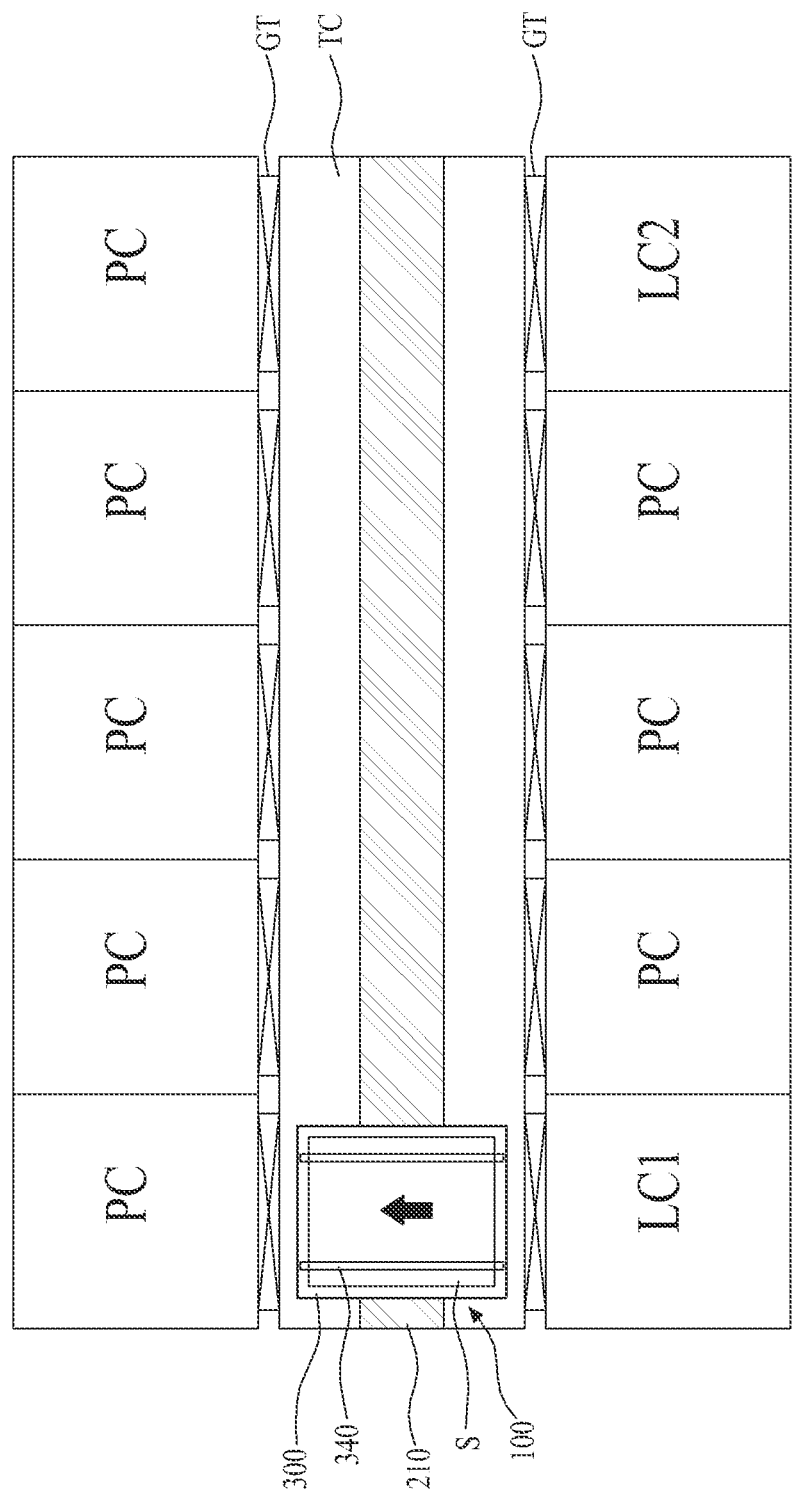

As shown in FIG. 11, the bi-directional substrate transferring device 100 retracts the sliding bars 414, 416, and 418 of the first bi-directional sliding fork 330, onto which the substrate (S) is placed, to their original positions on the fork frame 320; slides the sliding bars 414, 416 and 418 of the first bi-directional sliding fork 330 into the second direction.

Figure 12:
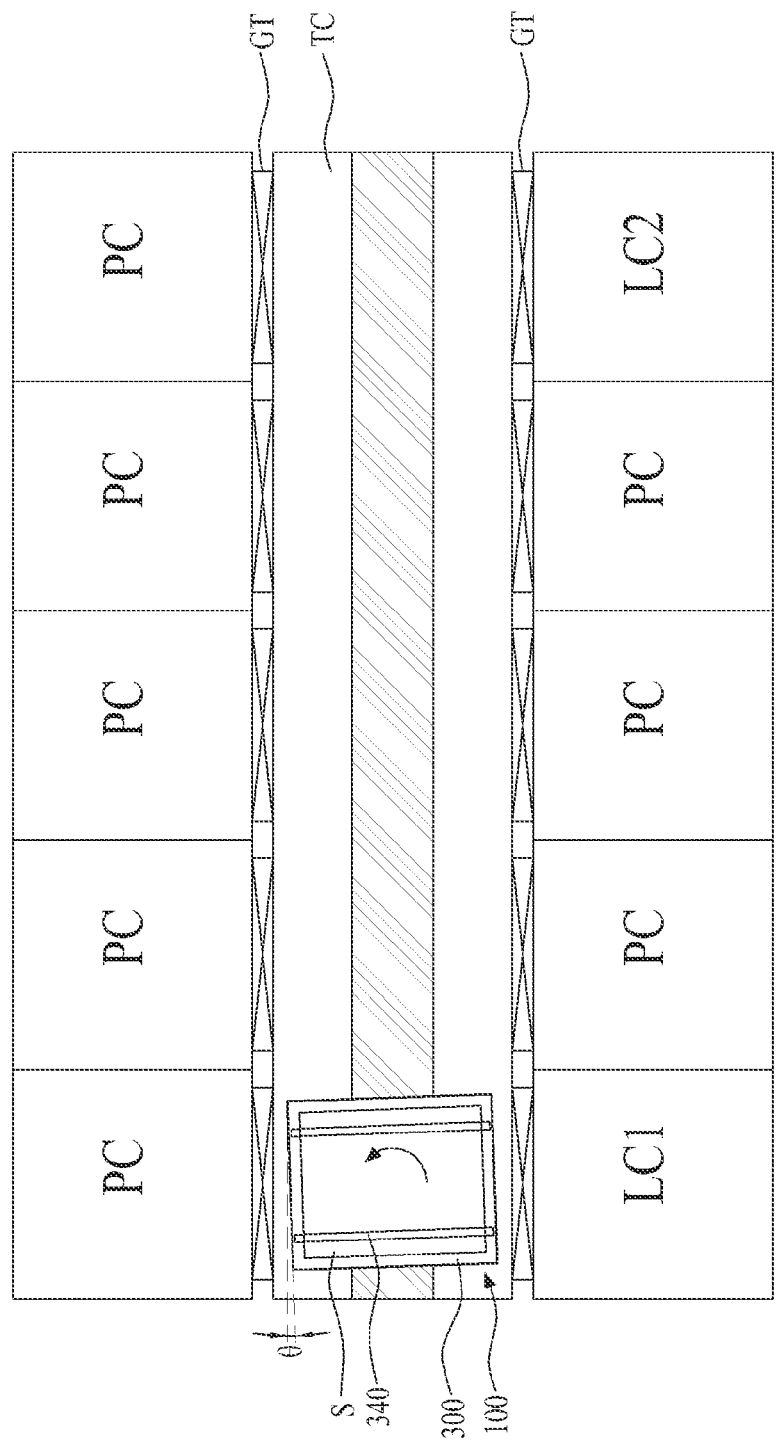

As shown in FIG. 12, the bi-directional substrate transferring device 100 rotates the bi-directional substrate transferring unit 300 at a predetermined angle (θ) by operating the rotating unit 600 so that the bi-directional transferring unit 300 is rotated corresponding to the substrate-loading position of the processing chamber (PC) to be provided with the substrate (S) loaded thereinto. That is, the driving member 624 of the rotating unit 600 is rotated corresponding to the substrate-loading position of the processing chamber (PC) to be provided with the substrate (S) loaded thereinto, to thereby make the linear movement of the housing 625. Following the linear movement of the housing 625, the rotating axis part 640 is linearly moved. Thus, the second rotating guide 630, which is interlocked with the linear movement of the rotating axis part 640, rotates by the guide of the first rotating guide 610, whereby the base frame 310 rotates, and the first bi-directional sliding fork 330 with the substrate (S) placed thereonto is rotated at a predetermined angle (θ), and aligned to the substrate-loading position of the processing chamber (PC) to be provided with the substrate (S) loaded thereinto.

Figure 13:
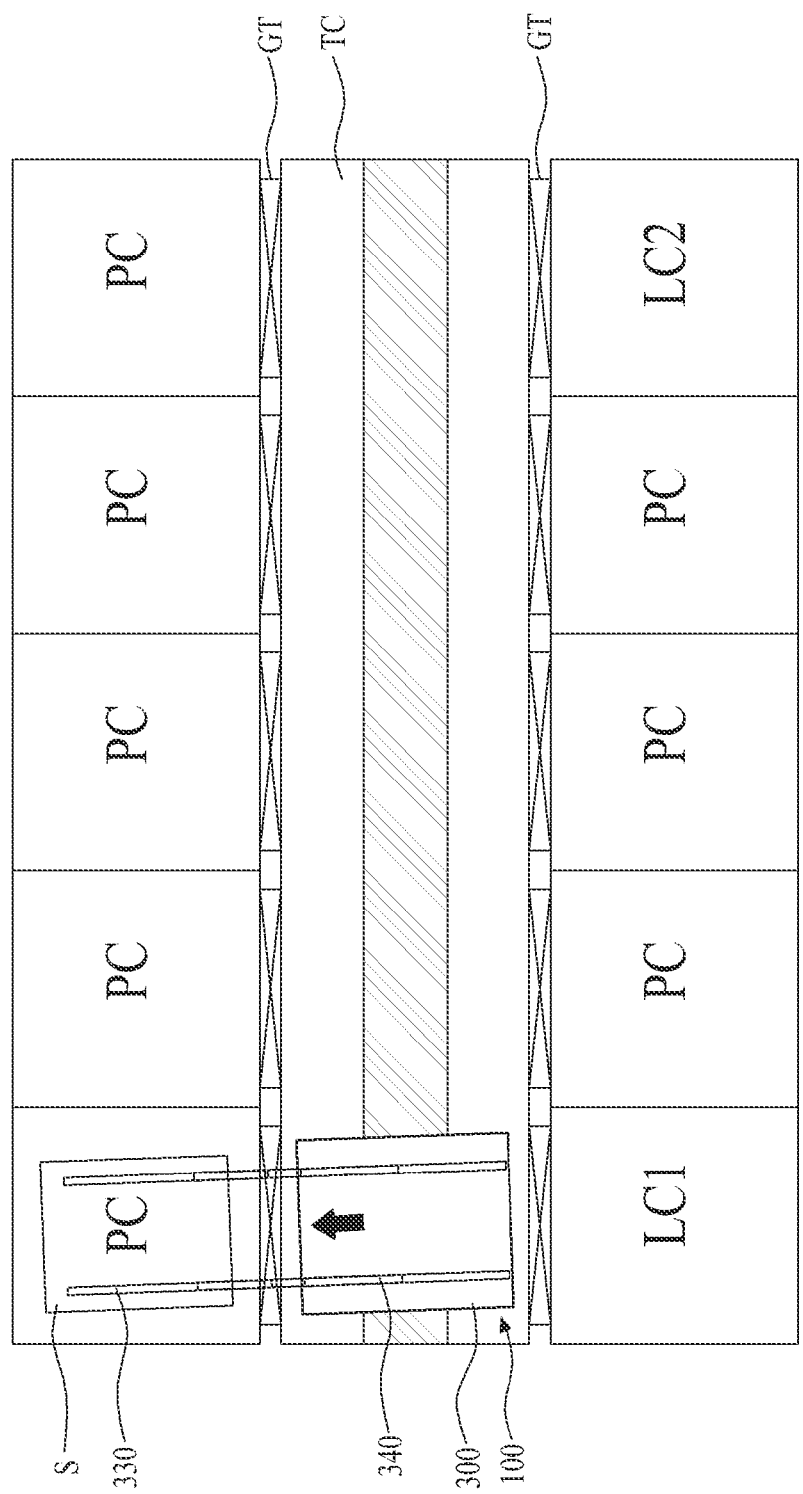

Then, as shown in FIG. 13, the bi-directional substrate transferring device 100 slides the sliding bars 414, 416 and 418 of the first bi-directional sliding fork 330 into the second direction, that is, the inside of the processing chamber (PC); lowers the fork frame 320 to the predetermined height by operating the fork lift 350; and loads the substrate (S) placed onto the first bi-directional sliding fork 330 into the inside of the processing chamber (PC). At this time, the substrate (S) may be loaded onto a substrate supporting member (not shown) or substrate supporting frame (not show) of the processing chamber (PC).

Figure 14:
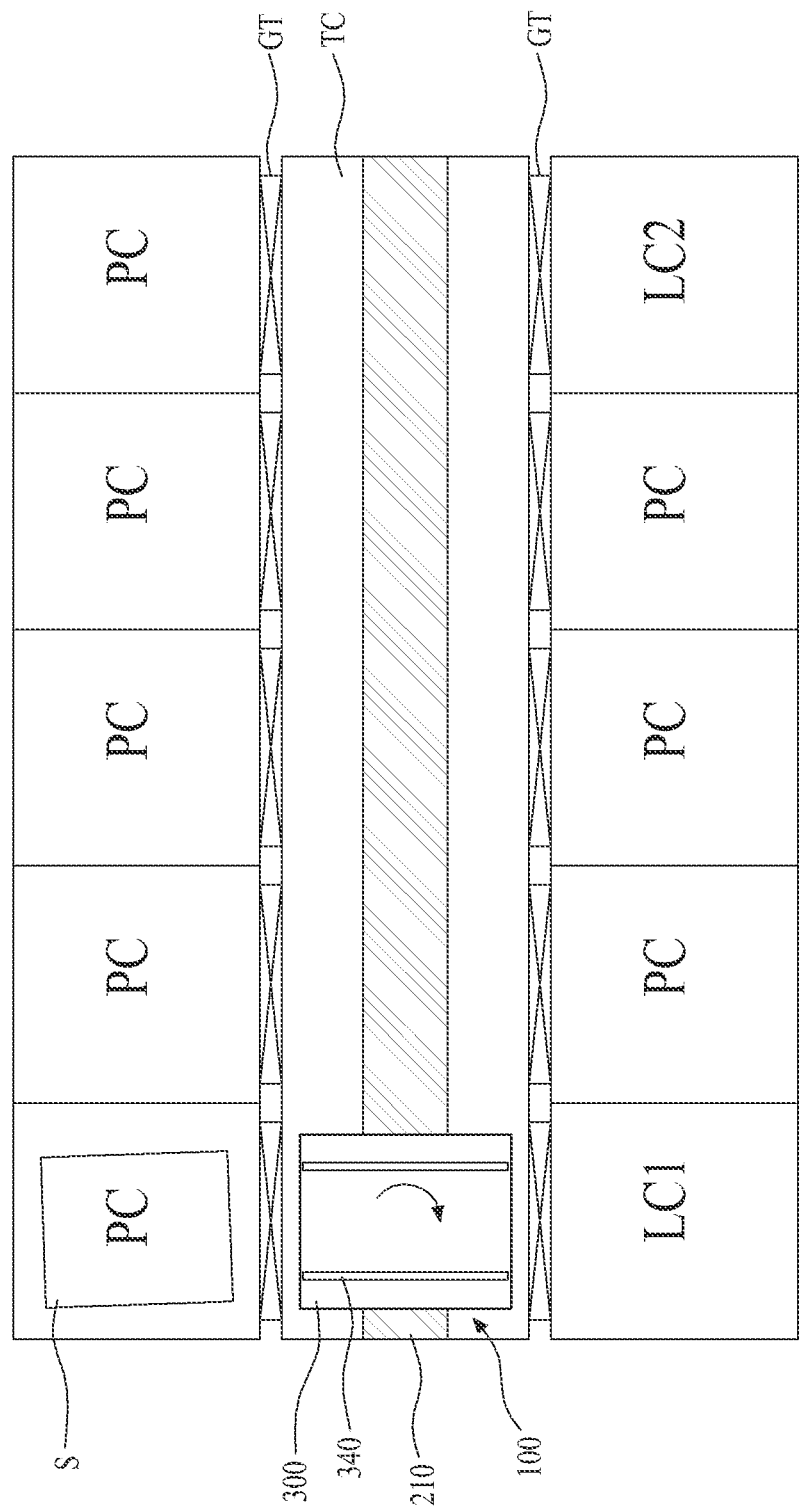

As shown in FIG. 14, when the substrate (S) is loaded into the processing chamber (PC), the bi-directional substrate transferring device 100 slides the sliding bars 414, 416 and 418 of the first bi-directional sliding fork 330 to the first direction, whereby the sliding forks 414, 416 and 418 are retracted to the original positions on the fork frame 320. Then, the bi-directional substrate transferring unit 300 is rotated to the original position by operating the rotating unit 600.

In the substrate transferring method of the substrate processing system according to the embodiment of the present invention, the first and second bi-directional sliding forks 330 and 340 are rotated at a predetermined angle (θ) by the rotation of the rotating unit 600, and then the first and second sliding forks 410 and 420 or/and the third and fourth sliding forks 510 and 520 are extended or retracted so that the substrate (S) is aligned to the precise substrate-loading position of the processing chamber (PC).

As mentioned above, the substrate transferring method of the substrate processing system according to the present invention has the following advantages.

First, the substrate (S) is bi-directionally transferred through the bi-directional substrate transferring device 100 between the two rows of the processing chambers (PCs) arranged linearly, thereby improving the substrate transferring efficiency and enhancing the yield.

Also, the plurality of sliding bars with the substrate (S) placed thereonto are rotated by the use of the rotating unit 600, and then slide bi-directionally so that substrate (S) is aligned to the precise substrate-loading position of the processing chamber (PC).

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A substrate processing system comprising:
   a transfer chamber which has at least one bi-directional substrate transferring device having a base frame bi-directionally transferring a substrate; and
   a plurality of processing chambers which apply a semiconductor-manufacturing process to the substrate, wherein the plurality of processing chambers are linearly arranged along two rows confronting each other, and the transfer chamber is between the two rows of the processing chambers,
   wherein the at least one bi-directional substrate transferring device comprises:
   a moving unit which is inside the transfer chamber and that moves horizontally, the moving unit including a driving member at an upper surface thereof and first rotating guides at corners of the upper surface of the moving unit, wherein the first rotating guides are connected to second rotating guides at corners of the base frame corresponding to the corners of the moving unit;
   a bi-directional substrate transferring unit which is in the moving unit, and transfers the substrate to the processing chamber through a bi-directional sliding movement, and transfers the substrate to the processing chamber through a bi-directional sliding movement; and
   a rotating unit having a rotation member and a housing therein, wherein the rotating unit is between the moving unit, the bi-directional substrate transferring unit, and the first and second rotating guides, and is configured to rotate the second rotating guides of the base frame at a predetermined angle by linearly moving the housing by rotation of the rotation member according to the driving member, wherein the second rotating guides follow the first rotating guides.

2. The substrate processing system according to claim 1, wherein the bi-directional substrate transferring unit comprises:
   the base frame which is in the moving unit;
   a fork frame which is on the base frame;
   first and second bi-directional sliding forks which have a plurality of bi-directional sliding members in the fork frame; and
   a fork lift which is at a lateral side of the fork frame, the fork lift lifting or lowering the first and second bi-directional sliding forks by lifting or lowering the fork frame.

3. The substrate processing system according to claim 2, wherein the rotating unit comprises:
   a first rotating guide at each corner of an upper surface of the moving unit;
   a rotating part at the upper surface of the moving unit;
   a second rotating guide at a rear surface of the base frame, following the first rotating guide; and
   a rotating axis part at the rear surface of the base frame, wherein the rotating axis part linearly moves by rotation of the rotating part, and makes the base frame rotate at a predetermined angle by rotation of the second rotating guide.

4. The substrate processing system according to claim 3, wherein the rotating unit comprises:
   a first bracket at the upper surface of the moving unit;
   a second bracket at the upper surface of the moving unit, at a predetermined interval from the first bracket;
   wherein the rotation member is rotatably supported by the first bracket while passing through the second bracket;
   the driving member is connected with the rotation member, and rotates the rotation member; and
   the housing is in the rotation member, and makes the rotating axis part move linearly.

5. The substrate processing system according to claim 4, wherein the rotating axis part comprises:
   a first support plate at the rear surface of the base frame;
   a rotating axis in the first support plate; and
   a second support plate in the rotating axis and the housing, wherein the second support plate makes the base frame rotate at a predetermined angle by rotation of the second rotating guide.

6. The substrate processing system according to claim 3, wherein the first and second rotating guides have a curved shape with a predetermined curvature.

7. The substrate processing system according to claim 2, wherein the first bi-directional sliding fork simultaneously slides both the first and second sliding forks by a linear motor; and each of the plurality of sliding members slides bi-directionally while being extended or retracted by a hydraulic or pneumatic pressure.

8. The substrate processing system according to claim 2, wherein the first bi-directional sliding fork comprises a position-detecting sensor configured to control the first fork slider by detecting a sliding position of the sliding members.

9. A substrate processing system comprising:
   first and second processing chambers confronting each other and arranged in parallel, the first and second processing chambers applying a semiconductor-manufacturing process to a substrate; and
   at least one bi-directional substrate transferring device having a base frame and a moving unit including a driving member at an upper surface thereof and first rotating guides at corners of the upper surface of the moving unit, wherein the first rotating guides are connected to second rotating guides at corners of the base frame corresponding to the corners of the moving unit, the bi-directional substrate transferring device being between the first and second processing chambers, the at least one bi-directional substrate transferring device transferring the substrate to the first or second processing chamber by simultaneously sliding a plurality of sliding members,
   wherein the at least one bi-directional substrate transferring device comprises a rotating unit having a rotation member and a housing therein, wherein the rotating unit is between the first and second rotating guides, plurality of sliding members and the second rotating guides at a predetermined angle by linearly moving the housing by rotation of the rotation member according to the driving member, wherein the second rotating guides follow the first rotating guides.

10. The substrate processing system according to claim 9, wherein the at least one bi-directional substrate transferring device further comprises:
    a moving unit inside the transfer chamber, which moves horizontally;
    a bi-directional substrate transferring unit in the moving unit, and that transfers the substrate to the processing chamber through a bi-directional sliding movement, and wherein the rotating unit is between the moving unit and the bi-directional substrate transferring unit, and rotates the bi-directional substrate transferring unit at a predetermined angle.

11. The substrate processing system according to claim 10, wherein the bi-directional substrate transferring unit comprises:
   a base frame in the moving unit;
   a fork frame on the base frame;
   first and second bi-directional sliding forks which have a plurality of bi-directional sliding members in the fork frame; and
   a fork lift at a lateral side of the fork frame, the fork lift lifting or lowering the first and second bi-directional sliding forks by lifting or lowering the fork frame.

12. The substrate processing system according to claim 11, wherein the rotating unit comprises:
   a first rotating guide at each corner of an upper surface of the moving unit;
   a rotating part at the upper surface of the moving unit;
   a second rotating guide at a rear surface of the base frame following the first rotating guide; and
   a rotating axis part at the rear surface of the base frame, wherein the rotating axis part linearly moves by rotation of the rotating part, and makes the base frame rotate at a predetermined angle by rotation of the second rotating guide.

13. The substrate processing system according to claim 12, wherein the rotating unit comprises:
   a first bracket at the upper surface of the moving unit;
   a second bracket at the upper surface of the moving unit at a predetermined interval from the first bracket;
   wherein the rotation member is rotatably supported by the first bracket while passing through the second bracket; and
   the housing is in the rotation member, and makes the rotating axis part move linearly.

14. The substrate processing system according to claim 13, wherein the rotating axis part comprises:
   a first support plate at the rear surface of the base frame;
   a rotating axis in the first support plate; and
   a second support plate in the rotating axis and the housing, wherein the second support plate makes the base frame rotate at a predetermined angle by the rotation of the second rotating guide.

15. The substrate processing system according to claim 12, wherein the first and second rotating guides have a curved shape with a predetermined curvature.

16. The substrate processing system according to claim 11, wherein the first bi-directional sliding fork comprises a position-detecting sensor configured to control the first fork slider by detecting a sliding position of the sliding members.

17. A substrate transferring method for transferring a substrate between a load-lock chamber and a processing chamber, the processing chamber confronting the load-lock chamber, comprising:
   transferring any one of at least one bi-directional substrate transferring device to a space between the load-lock chamber and the processing chamber, wherein the bi-directional substrate transferring device comprises a moving unit, a bi-directional substrate transferring unit, and a rotating unit, the bi-directional substrate transferring unit having a base frame, the moving unit including a driving member at an upper surface thereof, and first rotating guides at corners of the upper surface of the moving unit, wherein the first rotating guides are connected to second rotating guides at corners of the base frame corresponding to the corners of the moving unit, and the rotating unit having a rotation member and a housing therein and being between the moving unit, the bi-directional substrate transferring unit, and the first and second rotating guides;
   loading the substrate by linearly moving a plurality of bi-directional sliding members in the bi-directional substrate transferring unit into the load-lock chamber at the same time, and restoring the plurality of sliding members to their original positions by simultaneous linear movement;
   rotating the plurality of sliding members and the second rotating guides at a predetermined angle by rotating the base frame of the bi-directional substrate transferring unit following an operation of the rotating unit, wherein the operation of the rotating unit comprises linearly moving the housing by rotating the rotation member according to the driving member, wherein the second rotating guides follow the first rotating guides;
   loading the substrate rotated at a predetermined angle to the processing chamber by linearly moving the plurality of rotated sliding members;
   restoring the plurality of rotated sliding members to their original positions by linear movement; and
   rotating the plurality of sliding members to their original positions by rotating the bi-directional substrate transferring unit to its original position according to an operation of the rotating unit.

18. The substrate transferring method according to claim 17, wherein rotating the plurality of sliding members at a predetermined angle comprises:
   linearly moving a rotating axis part following linear movement of the housing, wherein the rotating axis part is on the housing and a rear surface of the base frame; and
   rotating the base frame at a predetermined angle by rotating a second rotating guide on a rear surface of the base frame according to linear movement of the rotating axis part.

19. The substrate transferring method according to claim 17, wherein the at least one bi-directional substrate transferring device is transferred by a linear motor; and each of the plurality of sliding members slides bi-directionally while being extended or retracted by a hydraulic or pneumatic pressure.

20. A substrate transferring method for transferring a substrate between a load-lock chamber and a processing chamber, the processing chamber confronting the load-lock chamber, comprising:
   transferring any one of at least one bi-directional substrate transferring device to a space between the load-lock chamber and the processing chamber, wherein the bi-directional substrate transferring device comprises a moving unit, a bi-directional substrate transferring unit, and a rotating unit, the bi-directional substrate transferring unit having a base frame, the moving unit including a driving member at an upper surface thereof, and first rotating guides at corners of the upper surface of the moving unit, wherein the first rotating guides are connected to second rotating guides at corners of the base frame corresponding to the corners of the moving unit, and the rotating unit having a rotation member and a housing therein, the rotating unit being between the first and second rotating guides;
   loading the substrate by linearly moving a plurality of bi-directional sliding members in the bi-directional substrate transferring device into the load-lock chamber at the same time, and restoring the plurality of sliding members to their original positions by simultaneous linear movement;

rotating the plurality of sliding members and the second rotating guides at a predetermined angle, wherein the second rotating guides follow the first rotating guides by rotating the base frame following an operation of the rotating unit that comprises linearly moving the housing by rotating the rotation member according to the driving member;

loading the substrate rotated at a predetermined angle to the processing chamber by sliding the plurality of rotated sliding members at the same time;

restoring the plurality of rotated sliding members to their original positions by linear movement; and rotating the plurality of sliding members to their original positions.

* * * * *